United States Patent [19]

Cohn

[11] Patent Number: 5,355,577
[45] Date of Patent: Oct. 18, 1994

[54] METHOD AND APPARATUS FOR THE ASSEMBLY OF MICROFABRICATED DEVICES

[76] Inventor: Michael B. Cohn, 163 Highland Ave., Short Hills, N.J. 07078

[21] Appl. No.: 902,986

[22] Filed: Jun. 23, 1992

[51] Int. Cl.$^5$ .................. H01S 4/00; B23P 19/00
[52] U.S. Cl. .................. 29/592.1; 29/832; 29/729; 29/744; 29/DIG. 46
[58] Field of Search ............ 29/DIG. 46, 743, 744, 29/592.1, 832, 729

[56] References Cited

U.S. PATENT DOCUMENTS

| | | | |
|---|---|---|---|
| 3,439,416 | 4/1969 | Yando | 29/832 |
| 3,812,569 | 5/1974 | Kufner et al. | 29/DIG. 46 |
| 4,111,294 | 9/1978 | Carpenter et al. | 198/381 |
| 4,194,668 | 3/1980 | Akyurek | 228/6 A |
| 4,542,397 | 9/1985 | Biegelson | 357/32 |
| 4,554,611 | 11/1985 | Lewin | 361/234 |
| 4,802,951 | 2/1989 | Clark et al. | 156/630 |
| 4,843,035 | 6/1989 | Takashima | 437/209 |
| 4,907,062 | 3/1990 | Fukushima | 375/75 |
| 4,962,441 | 10/1990 | Collins | 361/234 |
| 5,034,802 | 7/1991 | Liebes | 357/74 |
| 5,075,253 | 12/1991 | Sliwa | 437/209 |

OTHER PUBLICATIONS

Huang, Y. and R. Pethig, "Electrode Design for Negative Dielectrophoresis," *Measurement Science and Technology* 2(1991) 1142-1146.

Cohn, M. B., "Self-Assembling Electrical Networks . . ." Proceedings of 1991 Int'l Conf. on Solid-State Sensors & Actuators, San Francisco, Jun. 1991.

*Primary Examiner*—P. W. Echols

[57] ABSTRACT

Abstract: A method of rapidly assembling many discrete microelectronic or micro-mechanical devices 56 (FIG. 2 ) in a precise configuration (FIG. 8f). The devices are placed randomly on a template (FIG. 3 ) consisting of a pair of oppositely charged planar electrodes. The upper electrode contains a multiplicity of apertures. The template is vibrated and the devices are attracted to the apertures and trapped thereat. The shape of a given aperture determines the number, orientation, and type of device that it traps. The process is completed by mechanically and electrically connecting the devices. The present method for serf-assembly allows many sub-millimeter sized electronic components or other particles to be rapidly assembled into a predetermined configuration. The method relies on vibration and weak electrical or magnetic forces.

6 Claims, 15 Drawing Sheets

METHOD AND APPARATUS FOR THE ASSEMBLY OF MICROFABRICATED DEVICES

FIELD OF INVENTION

This invention relates to electronic integrated circuits, specifically to an improved method for their manufacture.

DEFINITIONS

*micron size:* From 0.1 to 1000 microns in maximum dimension.

*microfabricated:* Describes a micron-sized object or device, fabricated by means of photolithography, and/or etching and/or material deposition methods typically employed in the production of integrated circuits.

*particle:* A small object which may have a complex or precisely-defined shape. For instance, a microfabricated gear with a diameter of 10 to 1000 microns: a complete microfabricated electric motor of similar size: a single transistor of size between 1 and 1000 microns square, of the type used in microelectronic circuits: or a microfabricated semiconductor laser.

DISCUSSION OF PRIOR ART

Modem integrated circuits (ICs) comprise up to ten million components fabricated simultaneously on a single piece of material. Thus, they are compact, economical and capable of complex functions. For an IC to work properly, however, nearly all of its individual components must be functional. The manufacturing yield of ICs therefore decreases exponentially in the number of components, and the net cost of production rises correspondingly.

This problem has been addressed by fault-tolerant designs, wherein spare devices can be "patched in" from one part of an IC die to replace faulty devices, as is well-known in the art. The approach does not work, however, when the geometric layout of the circuit cannot be altered, as in an active matrix liquid crystal display.

Several approaches have been described by which individual electronic components or modules might be separately fabricated, tested, then precisely assembled, so as to preserve the desirable high density and operating frequency of a monolithic IC.

FIGS. 1a and 1b, from the prior art of U.S. Pat. No. 3,439,416 (Yando, 1969) show an array of magnets on which particles 44 with magnetic coatings 42 are placed, vibrated, and trapped by the magnets so as to form a matching array. Each particle 44 is a microelectronic device. Unfortunately, the apparatus is intended for milli-inch (25 micron) sized particles, and cannot be readily down-scaled. As seen in FIG. 1a, the magnets are composed of magnetized layers 32, 36 alternating with non-magnetic layers 30,34,38 in a laminated structure. If the method were applied to the assembly of a modern integrated circuit from discrete one-micron particles, a total of about 10,000 laminations would be needed in a thickness of one centimeter, which does not seem feasible. Moreover, the method places severe restrictions on the shape and distribution of the particles in the array: the width of the particles must match the spacing of the magnetic layers and the distribution of the particles will be constrained by the parallel geometry of the laminations. Finally, it would seem that all the particles would have to be identical, since no means are provided to attract a specific particle to a specific magnet.

In U.S. Pat. No. 5,034,802 (Liebes et al, 1991 ), surface-mount devices and their substrate have mating physical features to allow rapid alignment. However, these features can only assist a human or robot assembling the devices, and do not eliminate the need for such a human or robotic assembler. Moreover, the approach is intended for centimeter-scale parts. Even given a very fast and accurate assembly robot, the approach does not seem practical for micron-scale components, or components numbering in the thousands. This is because the components are assembled on the substrate one by one, and not simultaneously.

U.S. Pat. No. 4,542,397 (Biegleson et al, 1985) shows parallelogram-shaped silicon dice and a method for assembling them into large arrays, taking advantage of the tiling structure. Unfortunately, this method also places restrictions on the size and shape of the array elements, and can produce only a few different array layouts. Accumulated position variations would, in addition, make interconnection difficult, since the array elements could not be reliably aligned with a lithographic mask. Finally, the KOH etchant employed to create the dice is incompatible with modem electronic fabrication processes.

U.S. Pat. No. 5,075,253 (Sliwa, 1991) shows a method for precisely abutting the edges of small dice, using surface tension. Each die is meant to carry an integrated circuit. Again, the dice must be designed to tile together, and the system is not self-assembling. All the dice must be placed in roughly correct position before the surface-tension-mediated assembly process is initiated.

Other references include U.S. Pat. Nos. 4,907,062, 4,111,294, 4,554,611, 4,843,035, 4,802,951, 4,962,441, 4,194,668. These variously constitute different approaches to the same problem, or similar approaches to different problem.

OBJECTS AND ADVANTAGES

Accordingly, an object of my invention is to distribute about one thousand or more micron sized components or particles in a planar pattern, in which the individual particles are precisely located and oriented in a predetermined manner.

An advantage is that particles at least as small as 0.1 micron size can be handled, whereas the methods of the prior art are impractical for particles below 10 microns.

A second advantage is that the particles spontaneously self-assemble into the desired configuration, so no human or robot is required to place the individual particles.

Another advantage is that particles of different shapes and sizes may be assembled together, in nearly any layout.

Still another advantage is that the necessary apparatus may be manufactured easily using existing technology.

A further advantage is that particles of differing materials or method of production may be combined: silicon and gallium arsenide, polymer, mechanical or chemical sensors, and micro-actuators.

Another advantage is that the particles are precisely aligned to a lithographically-fabricated template. There is no mechanism for accumulating position errors, so electrical connection may be effected by metal film deposition and lithographic patterning over the whole assembly, as shown in FIG. 8e–8f. The '387 and '253 prior art (Biegelson and Sliwa) allow only connections between neighboring elements.

An additional advantage is that, unlike lithography, the method may be used to create complex arrays of electronic components on a non-planar substrate.

A final advantage is that the attractive force responsible for the assembly process, being electrostatic, may be controllably modulated over time and space. Prior an employs gravity, magnetism, and surface tension, which cannot be easily modulated. Thus, using the current invention, if a given particle is found to be faulty after the assembly process, it may be released from its receptacle or binding site, and another particle allowed to take its place.

A second object is to induce the rapid self-assembly of microfabricated components or particles into complex, precise, three-dimensional structures.

Theoretical analysis of the serf-assembly process of the present invention shows that friction limits the speed and accuracy with which particles self-assemble. Therefore, several features—notably levitation (such as by dielectrophoresis) and lubrication means—have been introduced which reduce friction. These features are absent in the prior art, and constitute additional, unique advantages of the invention.

Further objects and advantages of my invention will become apparent from a consideration of the drawings and ensuing description.

DESCRIPTION OF THE DRAWINGS

In the drawings, closely related figures have the same number but different alphabetic suffixes.

FIG. 8a shows the electrostatic self-assembly template with lower and upper planar electrodes, dielectric layer, and electric field flux due to the applied voltage.

FIG. 8b shows the template along with particles which are being randomly shaken on top of it.

FIG. 8c shows the template and particles after the intensity of shaking has been decreased, so that the particles can bind to the template's binding sites.

FIG. 8d shows the template and bound particles after the excess particles have been removed.

FIG. 8e shows the metal film deposited over the template and bound particles.

FIG. 8f shows the system after the metal film has been etched to provide electrical connections between desired contact pads on the particles.

Figure 1A:
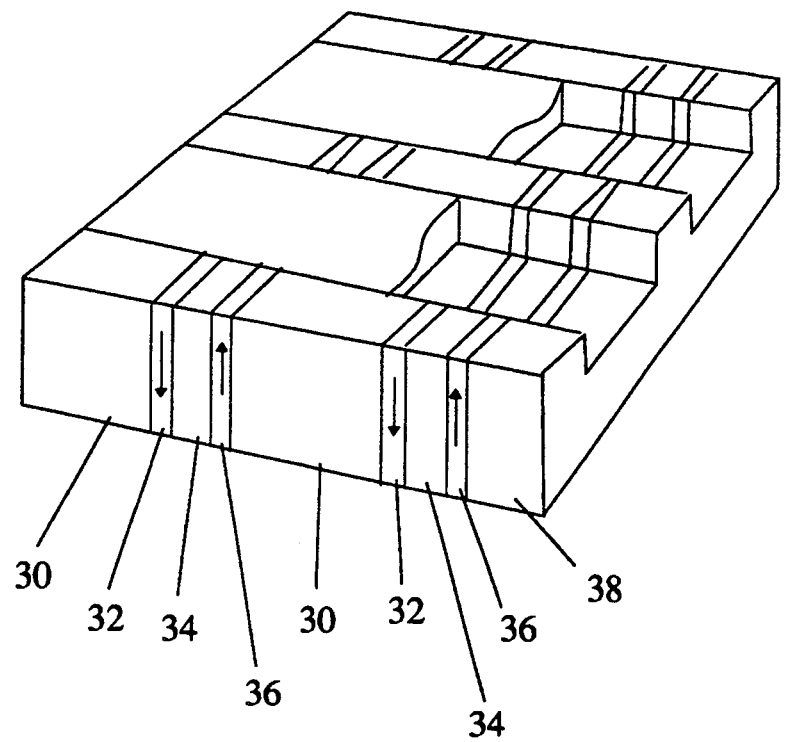
FIGS. 1a and 1b show apparatus for assembling discrete particles in an array using a magnetic template, from the prior art of U.S. Pat. No. 3,439,416 (Yando, 1969).
Figure 1B:
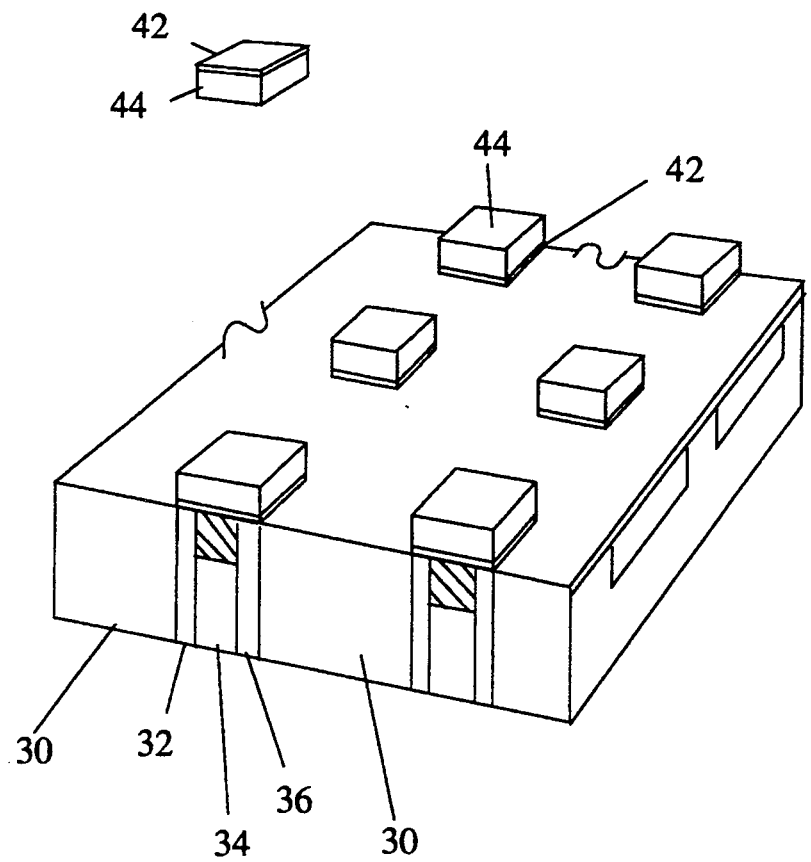

LIST OF REFERENCE NUMERALS 30. non-magnetic lamination
32. permanent magnet
34. magnetic spacer
36. permanent magnet
38. non-magnetic lamination
42. magnetic coating
44. element to be assembled onto magnetic template
50. high-voltage electric power supply
52. loudspeaker
54. wall of self-assembly cell
55. self-assembly cell
56. particle to be self-assembled onto electrostatic self-assembly template
58. clear window
60. electrostatic self-assembly template
62. sine wave voltage generator
64. aperture
65. binding site
66. upper planar electrode
68. dielectric layer
70. lower planar electrode
72. electric flux line
74. conductive pad
75. pattern
76. hole
77. pattern
78. registration post
79. particle
80. binding site for 79
81. particle
82. binding site for 81
84. electrical contact pad 86. metal film
88. electrical connection
90. container
92. liquid
94. three-dimensionally self-assembling particle
96. non-conductive material
97. interlocking surface
98. metallic core
99. interlocking surface
100. epoxy
102. oil coating
104. magnetic particle
106. magnetic recording medium
108. magnetic domain
110. upper planar electrode
114. middle planar electrode
116. lower planar electrode
118. particle bound in negative dielectrophoresis trap
119. aperture

SUMMARY

The present method for self-assembly allows many sub-millimeter sized electronic components or other particles to be rapidly assembled into a predetermined configuration. The method relies on vibration and weak electrical or magnetic forces.

Figure 2A:
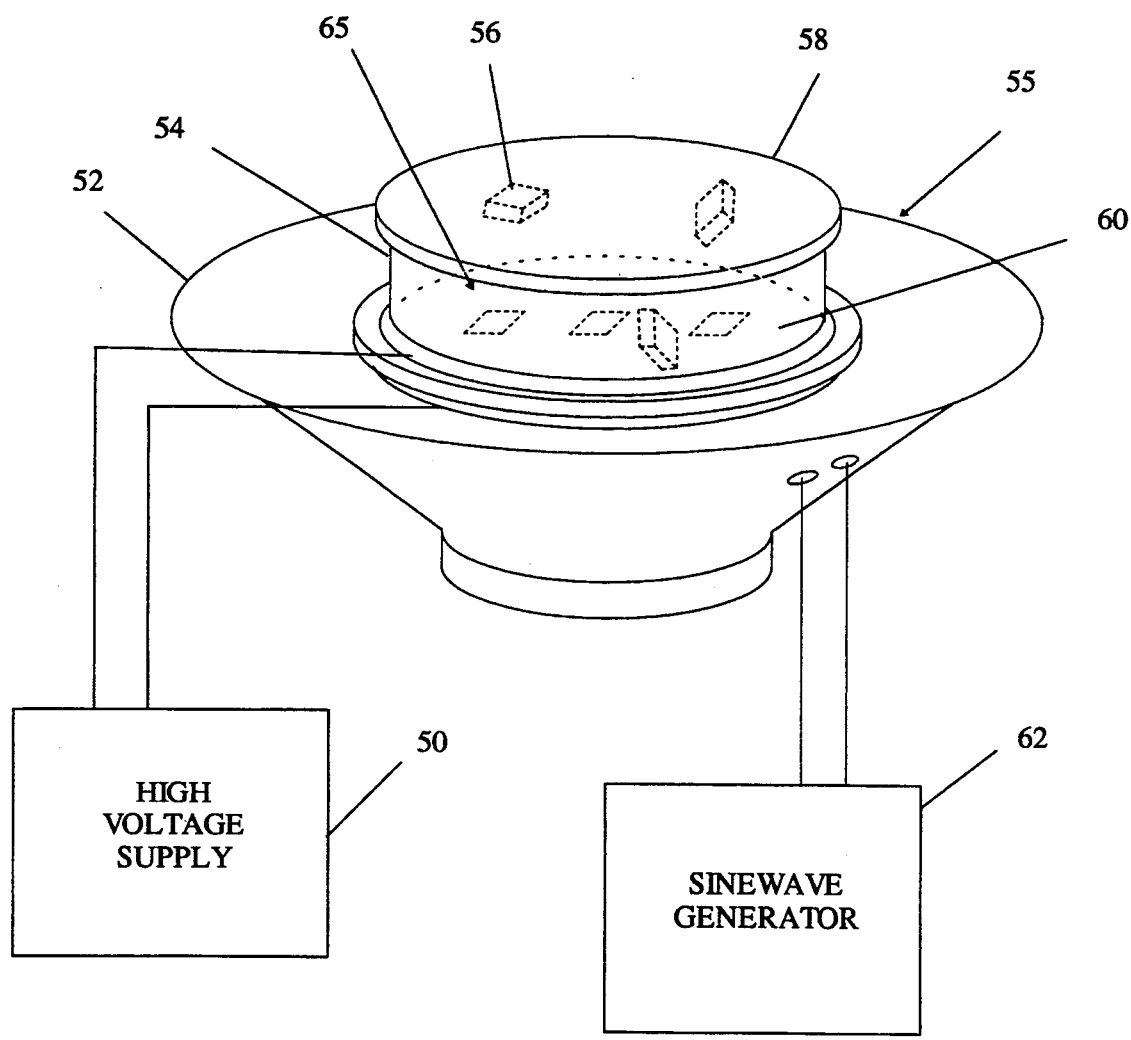
FIG. 2a shows a self-assembly system of the present invention, employing a loudspeaker and a container with an electrostatic template.
Figure 2B:
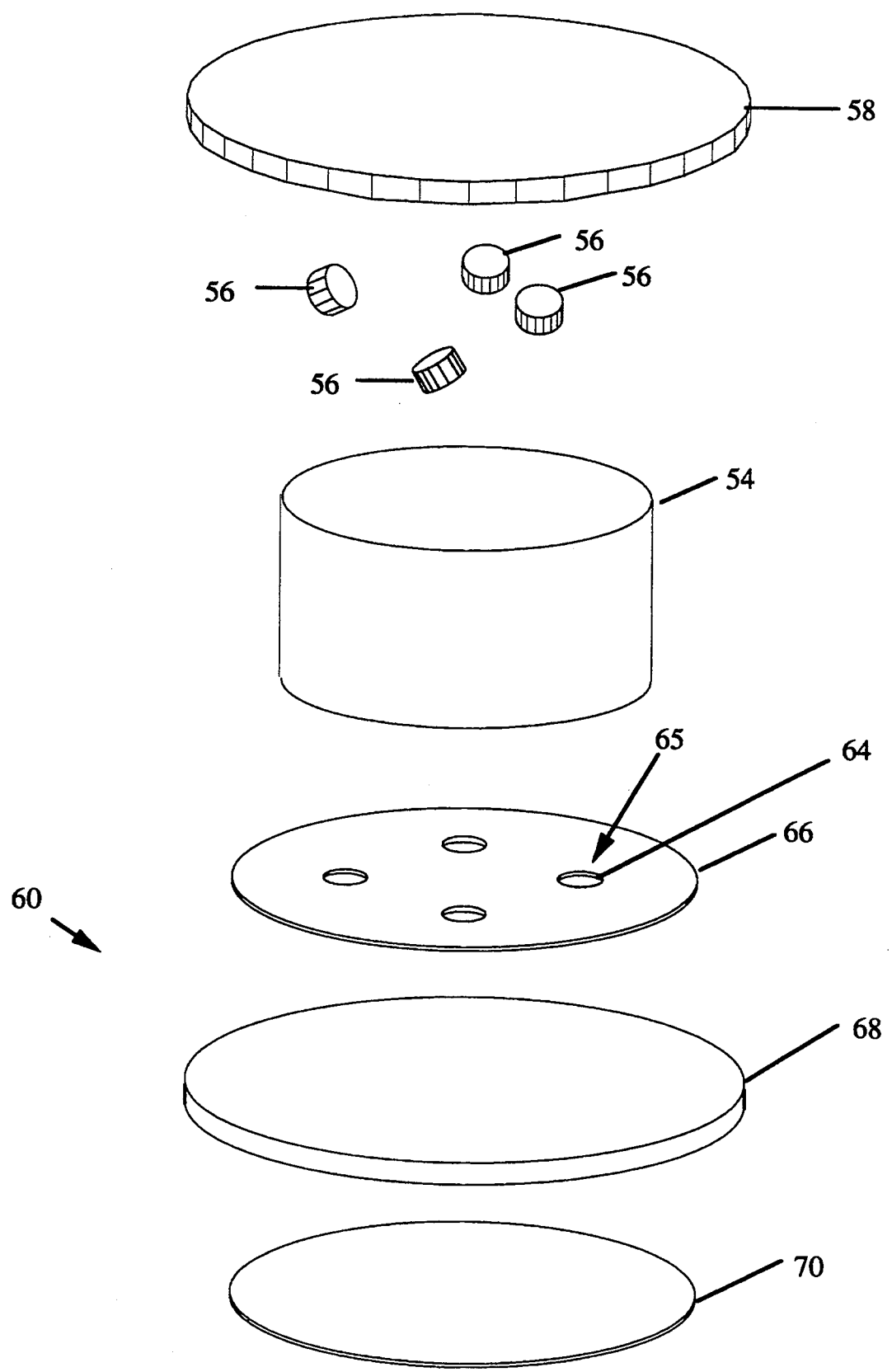
FIG. 2b is an exploded view of the container of FIG. 2a, showing the particles to be assembled within the container, as well as the three layers of the electrostatic template, at the floor of the container.
Figure 3:
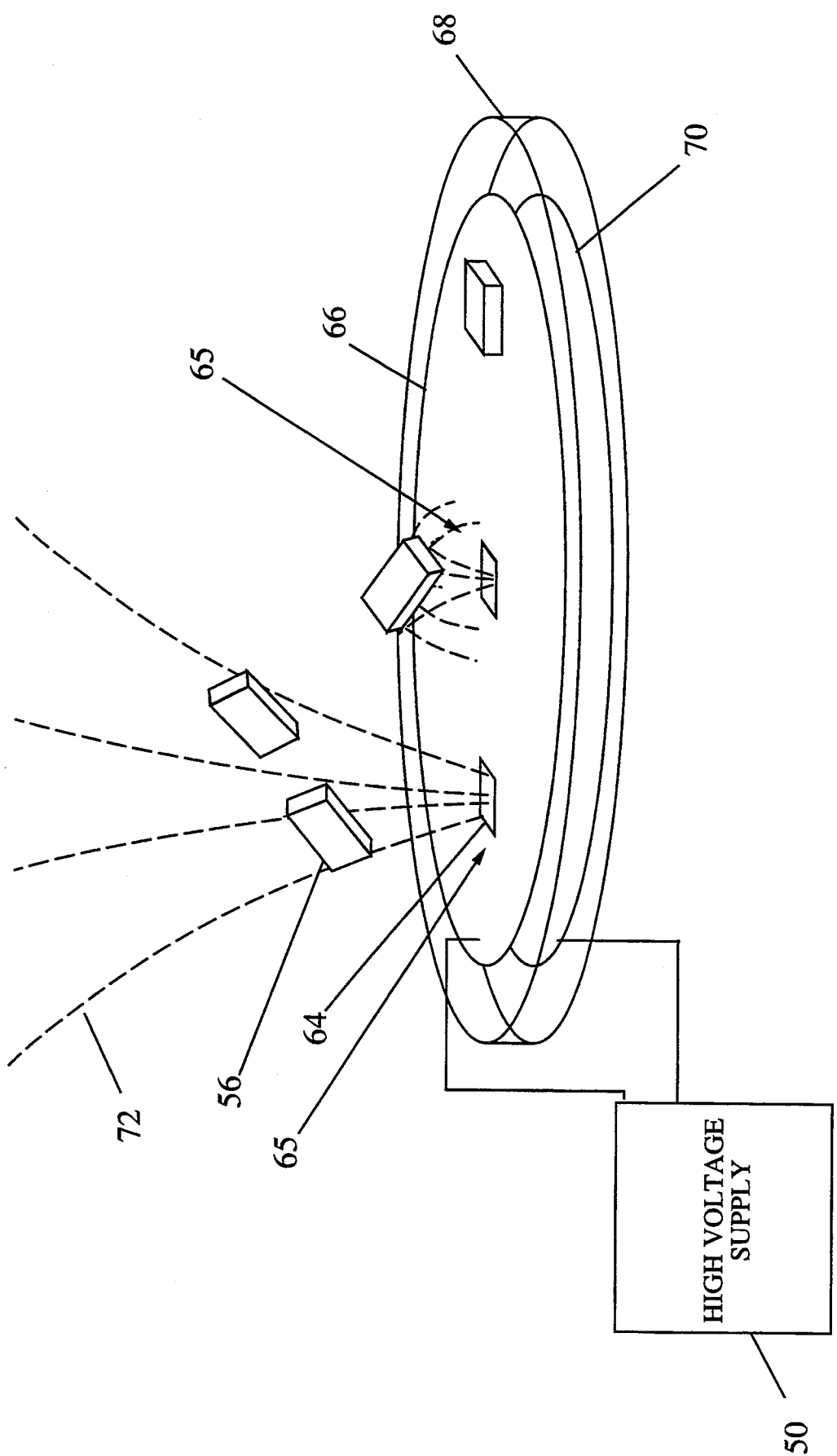
FIG. 3 is a view of an alternate electrostatic self-assembly template having three binding sites, each consisting of an aperture in the template's upper electrode, and particles in various stages of being bound at the binding sites.

Description—FIGS. 2 to 3

A typical embodiment of the self-assembly apparatus of the present invention is shown in FIG. 2. The key element is the self-assembly template, 60. Referring to FIG. 3, the self-assembly template comprises a dielectric sheet 68, clad on top and bottom with metal films, which films constitute electrodes 66, 70. The lower electrode 70 is connected to an oscillating voltage (about 8 kV, 60 Hz). The upper electrode 66 contains a multiplicity of apertures 64 and is tied to electrical ground. In FIG. 2, a short section of copper tubing forming a wall 54 is soldered to the upper electrode 66. A clear observation window 58 is affixed atop the wall 54, so that the self-assembly template 60, the wall 54, and the observation window 58 form a closed cylindrical container. This container is called the *self-assembly cell* 55. The self-assembly cell 55 is affixed to the cone of a loudspeaker 52, so that the cell vibrates when an oscillating voltage is supplied to the speaker from sine wave generator 62.

The self-assembly template 60 is essentially a parallel-plate capacitor. An intense electric field is confined between the electrodes 66 and 70, which correspond to the capacitor plates. In the vicinity of the apertures 64, this electric field emerges and is present at the template surface. It should be noted that dielectric material (most matter and, hence, particles 56) is naturally attracted to regions where strong electric fields are present. Therefore, the locus of an aperture 64 is a *binding site* 65 for a particle 56.

Operation—FIGS. 2, 3

Particles 56 are prepared, of micron size, using any of the fabrication techniques normally employed for microelectronic or micro-mechanical devices. The particles are roughly planar, carrying on their top surface one or more electronic or mechanical devices, such as a transistor, resistor, light-emitting diode, micro-motor, or micro-sensor. The particles' bottom surface is coated with a conductive film.

An excess of the particles are poured into the self-assembly cell 55, and the cell is closed. The square-wave generator 62, connected to the loudspeaker 52, is turned on, so that the self-assembly cell and the particles within are vibrated. The high-voltage supply 50 is also turned on. The vibration amplitude is initially large, sufficient to randomly bounce the particles throughout the self-assembly cell. Gradually, the vibration amplitude is decreased, and the particles are attracted toward the binding sites 65 and trapped there. As the amplitude is further decreased, the trapped particles vibrate weakly, settling into the precise centers of the binding sites.

At this point, the system is tipped by about 30 degrees, and excess unbound particles flow to the edge of the template where they are removed flora the self-assembly cell.

Note from FIG. 3 that a trapped particle covers the aperture which comprises its binding site. Since the underside of the particle is conductive, the electric field lines 72 emerging from the apertures 64 terminate on the particle 56. Thus, only one particle is attracted to each site.

Theory of Operation

The principle of this invention is introduced by Cohn, Kim and Pisano in "Self-Assembling Electrical Networks: An Application of Silicon Micromachining" (1991 *International Conference on Solid-State Sensors and Actuators*, San Francisco, 25 June, 1991).

The principle is to apply equilibrium thermodynamics to systems of man-made particles. This is to say, we design a machine or other system of small pans which must be assembled. We arrange that the potential energy of the system is minimized when the system is properly assembled. Then, we mechanically shake the pans in a random manner, slowly decreasing the strength of shaking. The Third Law of thermodynamics states that such a system will evolve toward its energy-minimizing state as the strength of shaking tends to zero. The shaking strength is analogous to the concept of "temperature" in the usual statement of the Third Law.

Figure 4:
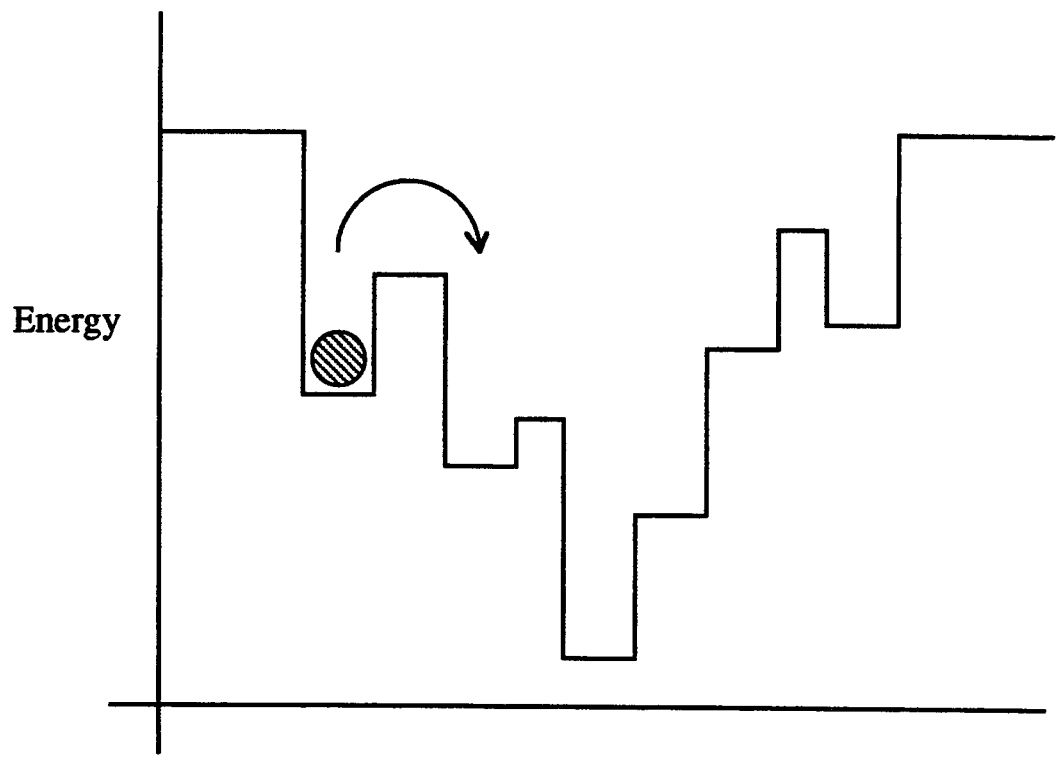
FIG. 4 is a pilot of the potential energy of a (hypothetical) particle as a function of position, showing the globe energy minimum and energy barriers.

Conceptually, one may picture a ball rolling down a hill, as in FIG. 4. Under the influence of gravity, the ball naturally tends to roll down the hill. When the ball encounters a depression or "local minimum," the shaking of the system will allow it to escape. For the most part, the ball will bounce back and forth among the low-lying states. As the shaking decreases in amplitude, a situation is reached where the shaking is sufficient to shake the ball out of the local minima but not out of the true global minimum at the bottom of the valley. If we shake for a long enough time, we can be essentially certain that the ball will end up in the true minimum-energy state at the very bottom of the valley.

The one-dimensional model of FIG. 4 may be generalized to a particle moving in two or three dimensions. A six-dimensional model can represent two particles moving in three dimensions. More dimensions may be added to represent more particles, or internal freedoms of the particles.

In self-assembly, the potential energy arises from attractive forces between elements of the system. If two specific elements—e.g. a particle and a binding site—are meant to assemble together, they are made to attract each other.

A theoretical treatment of self-assembly predicts (1) that small particles can be energetically and randomly agitated without fear of damaging them, and (2) friction in a self-assembling system is undesirable because it decreases the rate of self-assembly and increases the number of expected flaws in self-assembled structures.

DESCRIPTION AND OPERATION OF ALTERNATE EMBODIMENTS

Orientation Selectivity

Figure 5A:
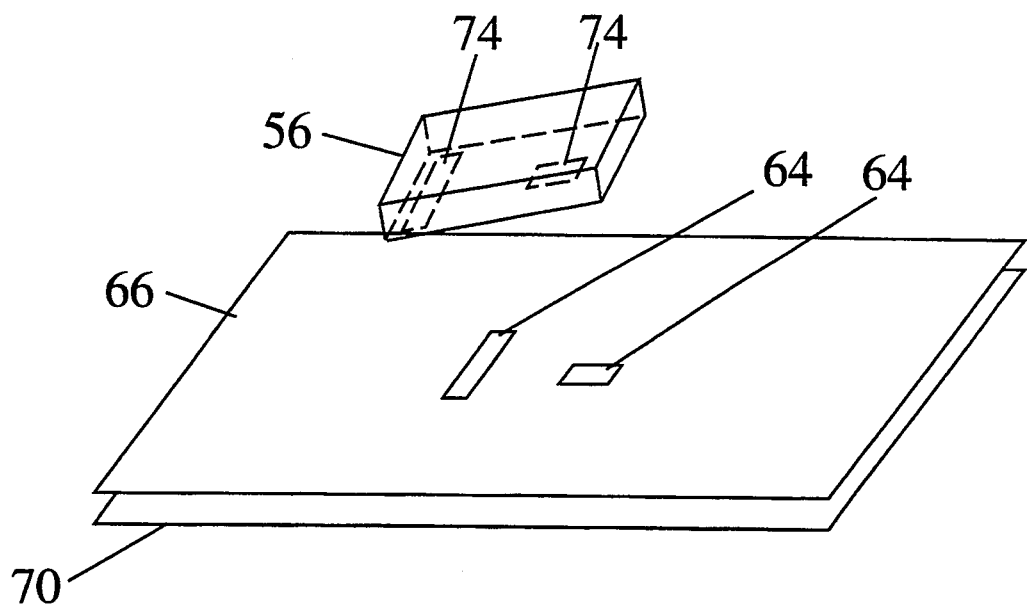
FIG. 5a shows another binding site and particle having asymmetrical electrode configurations to provide for binding the particle in a predetermined orientation.

An additional embodiment is shown in FIG. 5. In FIG. 5a, two apertures 64 in the upper template electrode 66 are employed, corresponding to conductive pads 74 on the underside of the self-assembly particle 56. The pattern is asymmetric with respect to heads-tails flipping of the particle.

Note that the potential energy of the system is proportional to the area of aperture not covered by the conductive pads. This is because the energy of a capacitor connected to a battery is $$u = \frac{1}{2} CV^2$$

where $C$ is capacitance and $V$ is the voltage. $C$ is proportional to surface area of the capacitor, or the effective area of the upper conductive film 66 in this case. If the apertures are covered by a conductor, the effective area is increased, $C$ is increased, and the system energy is proportionally decreased. Therefore, in the minimal-energy state, the particle 56 has its conductive pads aligned with and covering the apertures. The Third Law of thermodynamics thus provides that the particle will come to rest in this aligned configuration, as the mechanical vibration provided through the speaker is slowly attenuated.

Figure 5B:
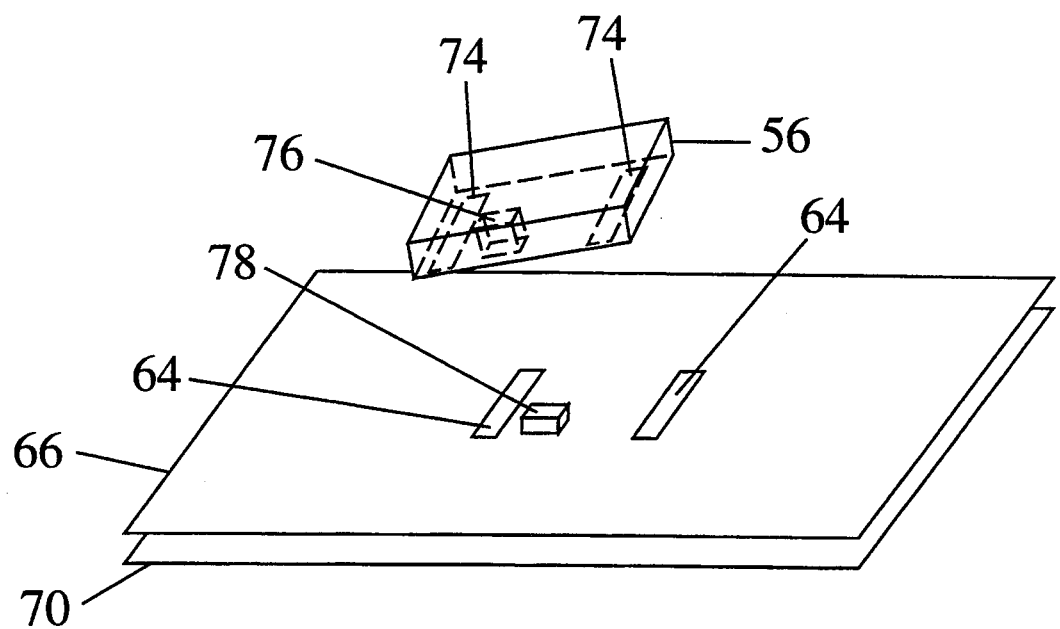
FIG. 5b shows a binding site having a registration post, and a particle with a matching hole, to provide for binding of the particle in a predetermined orientation.

Similarly, in FIG. 5b, the registration peg 78 will insert into the registration hole 76 so that the conductive pads 74 may get maximally close to the apertures 64. Thus, the desired orientation is assured.

Particle Species Selectivity

Figure 6:
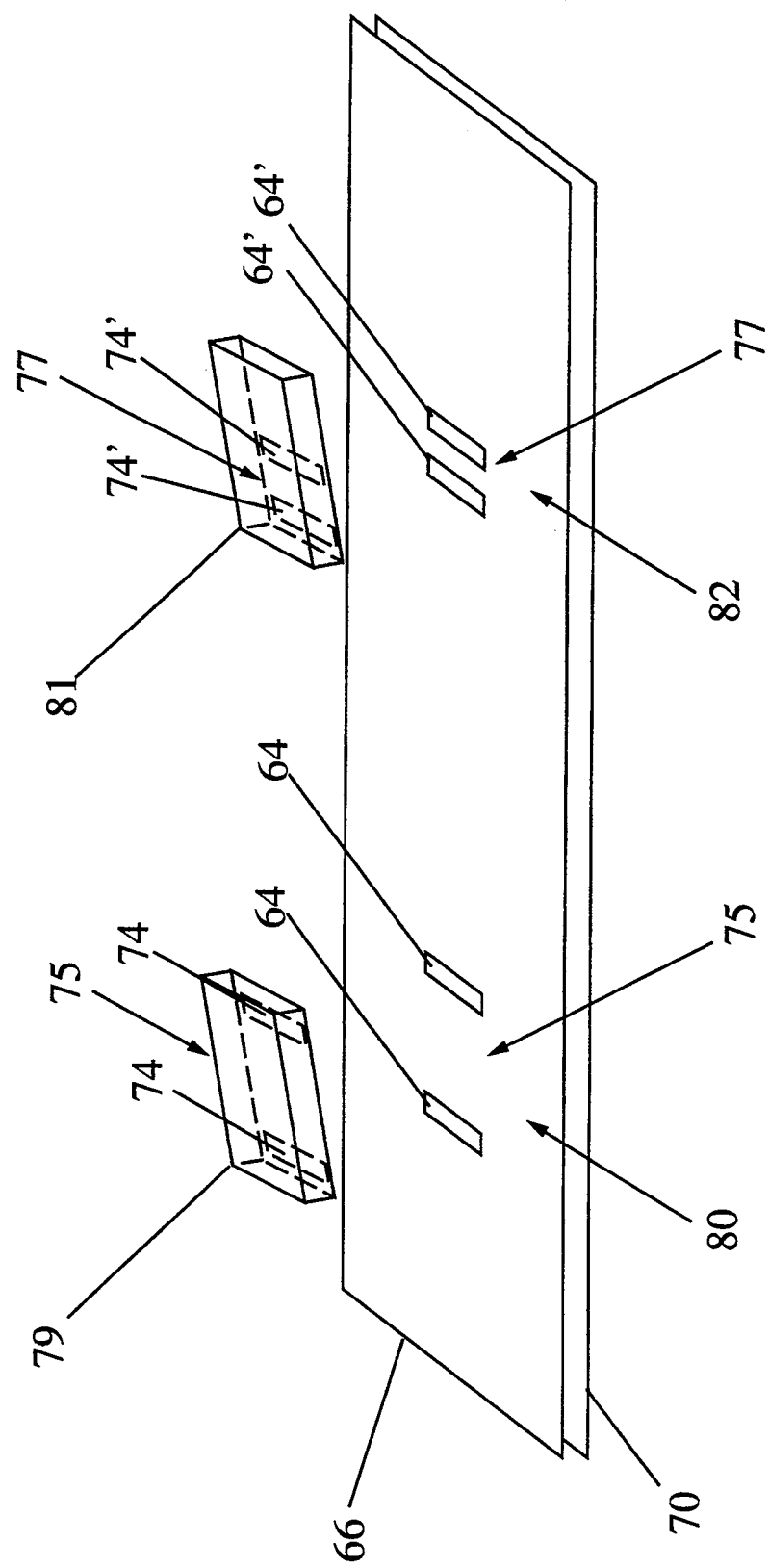
FIG. 6 depicts two binding sites with distinct electrode patterns, each site selectively binding a particle with a matching pattern.

In FIG. 6 are shown two binding sites with differently configured apertures 64, 64'. For each binding site, a particle 79, 81 is shown, with conductive pads 74, 74' of shape to match the apertures 64, 64'.

Figure 7:
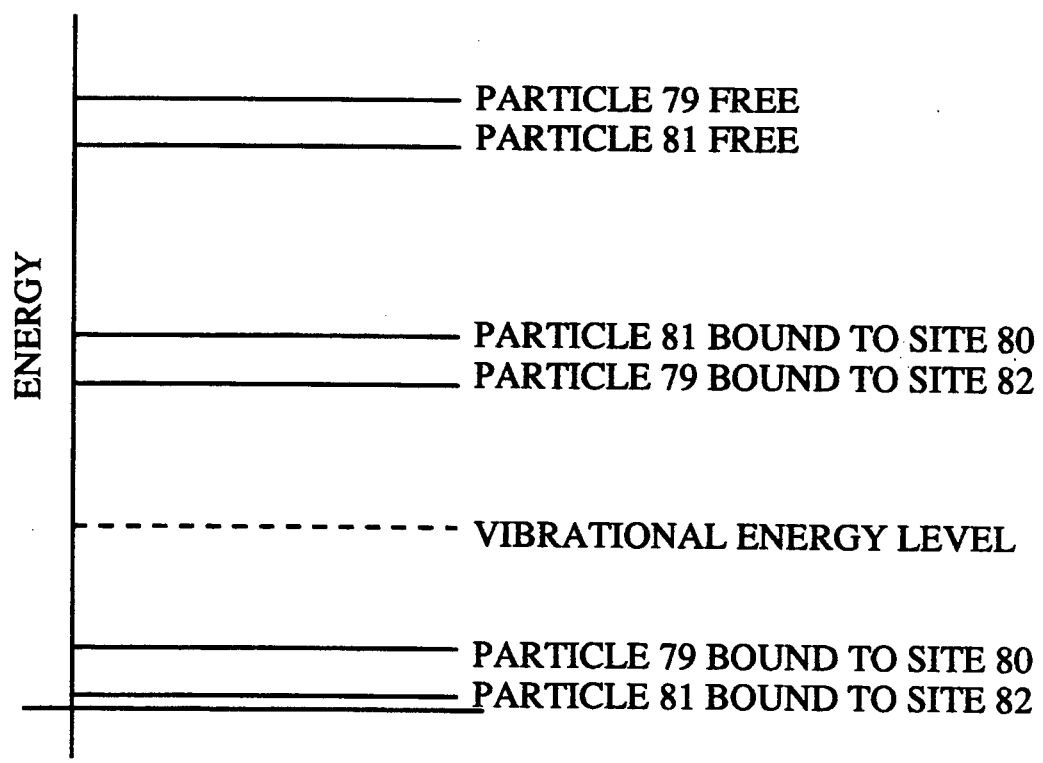
FIG. 7 shows an energy level diagram for a self-assembly process involving selective binding.

FIG. 6 demonstrates a method of preferentially binding a specific particle at a predetermined binding site. A binding site 80 is created, with a unique pattern 75 of apertures 64. A particle 79 is also created, with a conductive pattern 75 of conductive pads 74 matching the pattern of the apertures 64. A similar binding-site 82 and particle 81 are created, such that the pattern 77 of apertures 64 and conductive pads 74 is different from that of 80.79, but having substantially the same surface area. The potential energy minimum is achieved when the conductive pattern 75 of particle 79 covers the apertures 64 of potential site 80, and particle 81 similarly binding site 82. The binding energy of a 79/82 bond or 81/80 bond will be greater than 79/80 or 81/82, as illustrated by the graph of FIG. 7.

Attraction of Induced Dipoles for Three Dimensional Self-Assembly

Figure 9B:
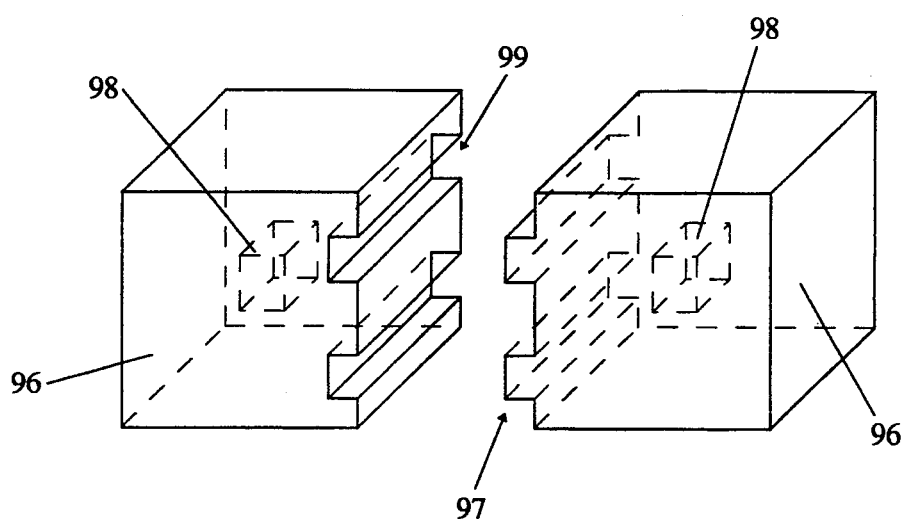
FIG. 9b is a detail of three-dimensionally self-assembling particles, each having an embedded conductive particle.
Figure 9C:
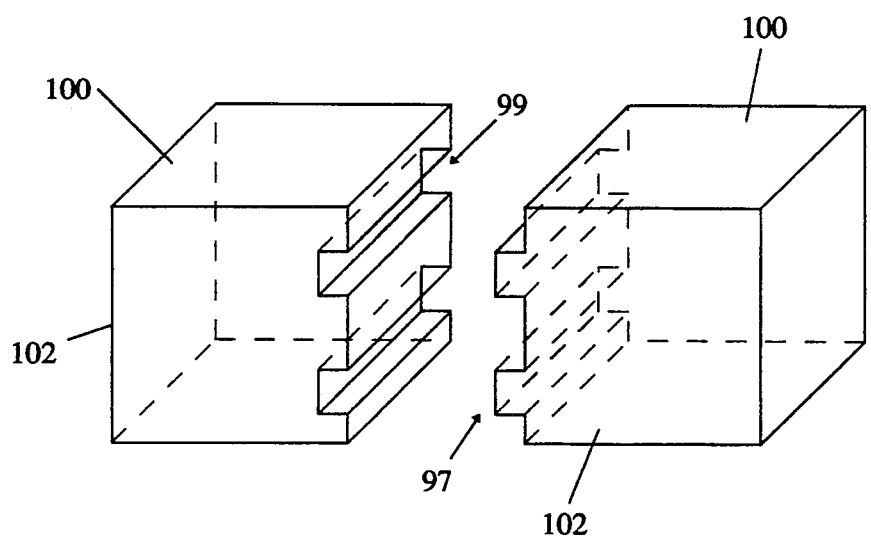
FIG. 9c shows particles having a coating of oil which causes them to self-assemble when immersed in water due to hydrophobic attraction.
Figure 9D:
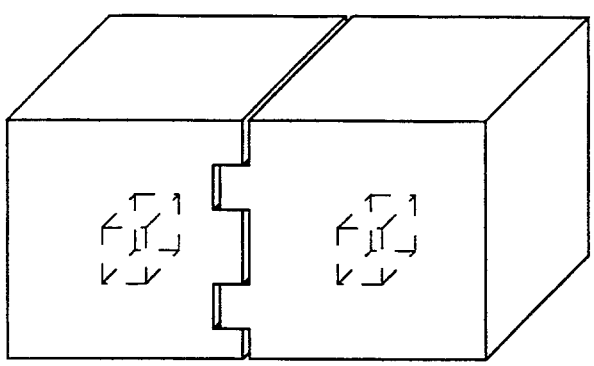
FIG. 9d shows three-dimensionally self-assembling particles in the assembled configuration.
Figure 9A:
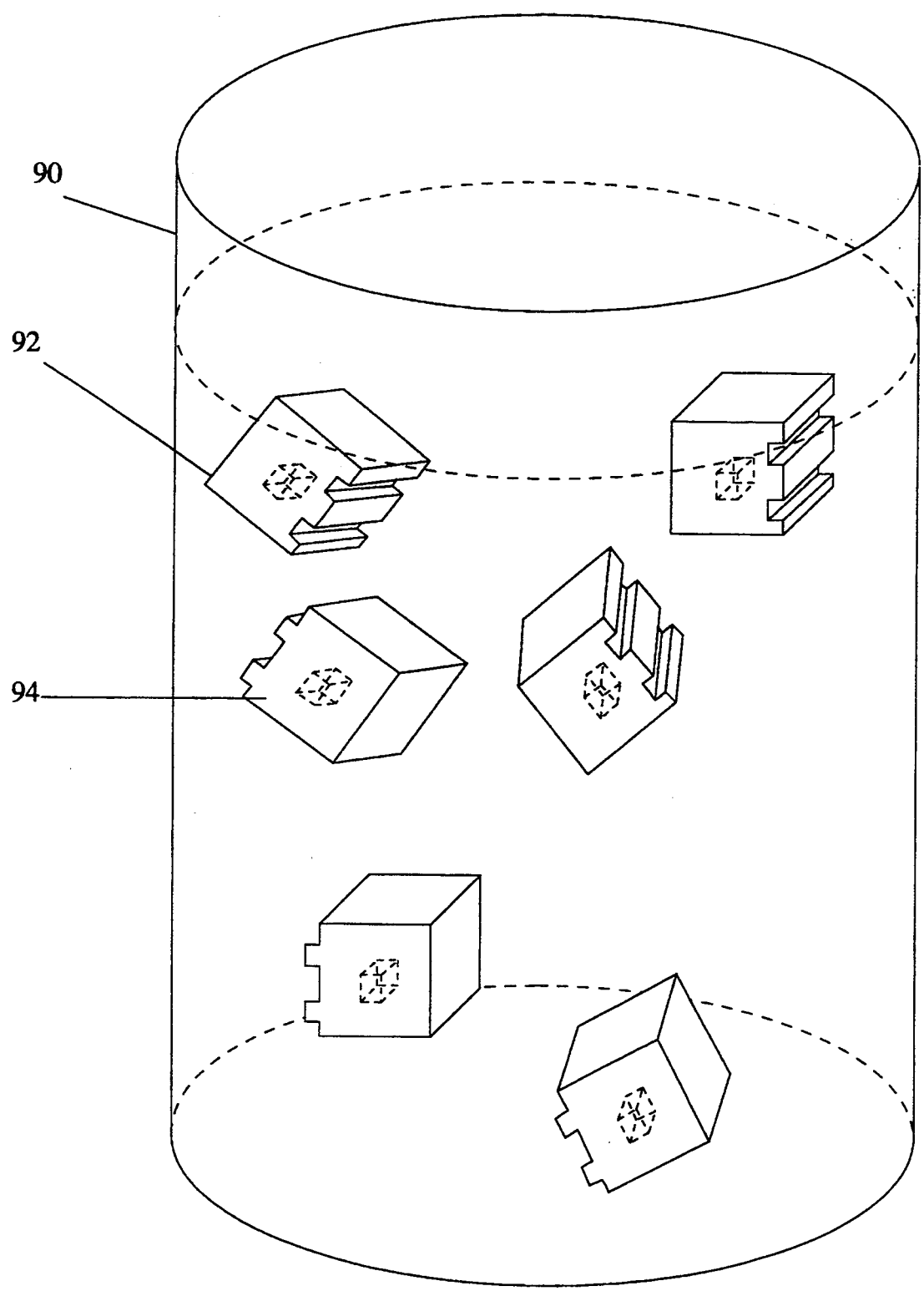
FIG. 9a depicts particles which self-assemble into three-dimensional structures while suspended in a liquid.

In FIG. 9a are shown particles 94 suspended in a liquid 92, held within a container 90. The particles are formed of photoresist or other convenient microfabrication material. The liquid can be hexane or other light, non-conductive substance. As shown in FIG. 9b, the particles have interlocking surfaces 97, 99. Each particles also has a metallic core 98 located relatively close to the interlocking surface and away from the other, flat, surfaces of the particle.

The metallic cores inside the photoresist particles are polarized by an externally applied electric field. Like a chain of paper clips picked up by a magnet, the particles are attracted to each other. Proper registration of the matched surfaces allows the closest possible approach of one metallic core to the other. Therefore, proper registration of the surfaces minimizes the potential energy of the system and the particles will spontaneously assume this configuration, shown in FIG. 9d.

Hydrophobic Attraction in Aqueous Medium for 3D Self-Assembly

In FIG. 9c is shown a pair of molded plastic (TAP Plastic, El Cerrito, CA, "Casting Resin") particles 100. The particles have mating surface features, and are suspended in water. Both parts are coated with a film of vegetable oil 102.

The mutual attraction of the oily surfaces of the particles causes them to assemble together, minimizing surface area. The oil provides both attractive force and lubrication. Lubrication reduces friction, accelerating the self-assembly process (in the manner of an enzyme) and making it more accurate, as explained in Cohn et al, referenced above.

Analogously, the particles may be coated or permeated with water, and suspended in a hydrophobic medium. In this case, the particles will again be mutually attracted.

Self-Assembled Microcircuit

FIGS. 8a through 8f show a step-by-step process using self-assembly to produce a working electronic circuit.

Figure 8A:
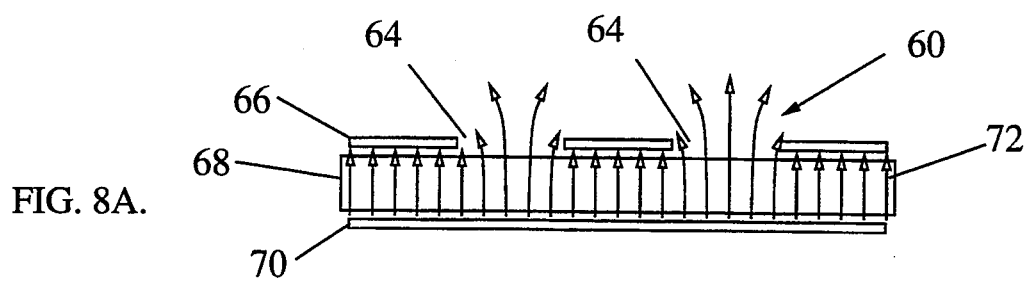
FIGS. 8a–8f illustrate steps for self-assembling discrete particles, each bearing one or more microelectronic devices, to make a working electronic circuit.

FIG. 8a shows a cross-section of an electrostatic self-assembly template 60, with the high-voltage supply (not shown) turned on. Arrows show the electric field flux 72 between the electrodes 66, 70. The field emerges from the apertures 64 in the top electrode 66.

Figure 8B:
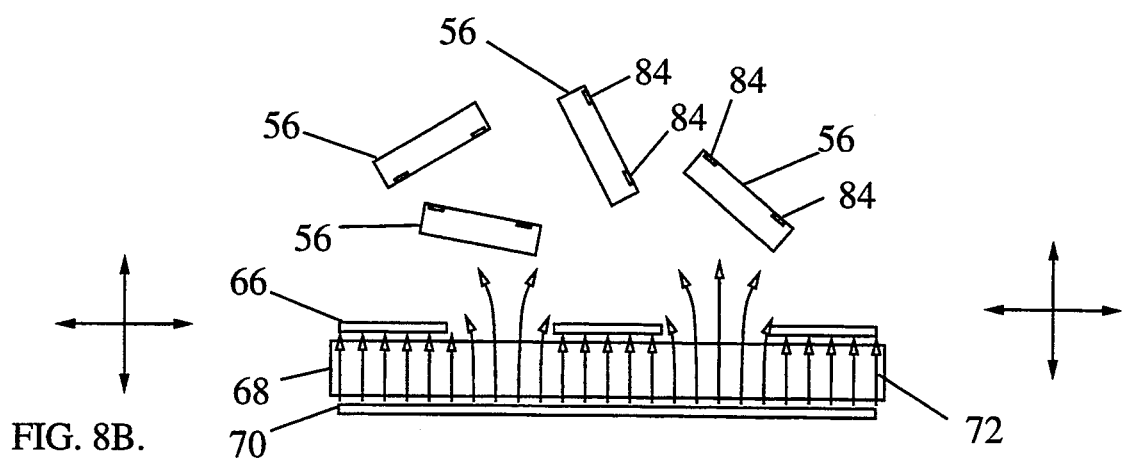

FIG. 8b shows particles 56 being randomly agitated on top of the template 60. Each particle carries a microelectronic device such as a transistor. The electrical terminals of the device are brought out to the contact pads 84.

Figure 8C:
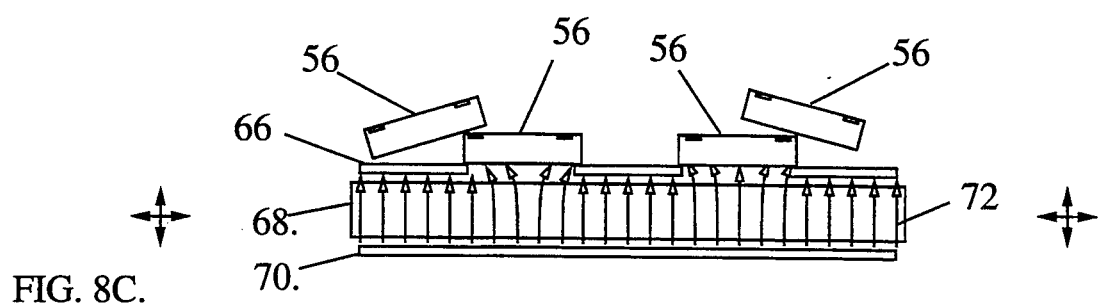

In FIG. 8c, the strength of the agitation has been decreased, so that particles 56 have bound to the binding sites comprised by the apertures 64.

Figure 8D:
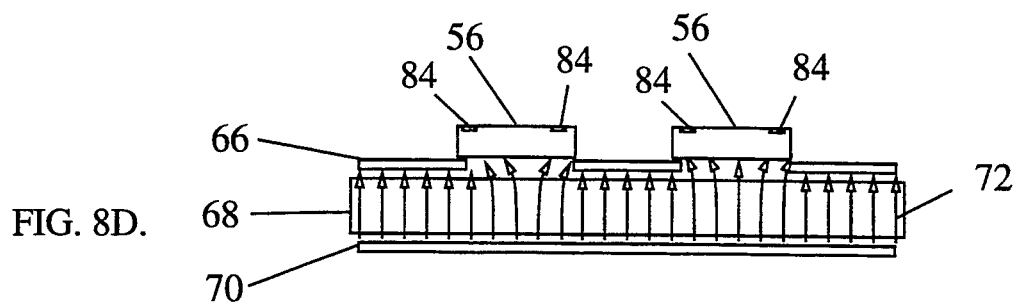

FIG. 8d shows the template and bound particles 56 after the excess particles have been removed and agitation has been stopped.

Figure 8E:
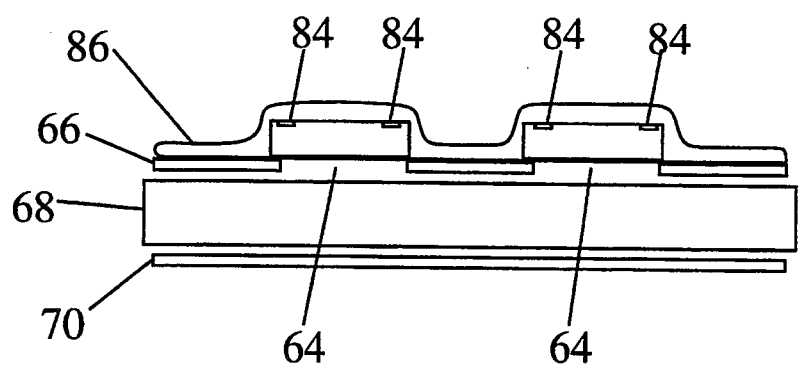

In FIG. 8e, a metal film 86 has been deposited over the template and bound particles. The electric field 72 has been turned off, because the metal film affixes the particles to the template.

Figure 8F:
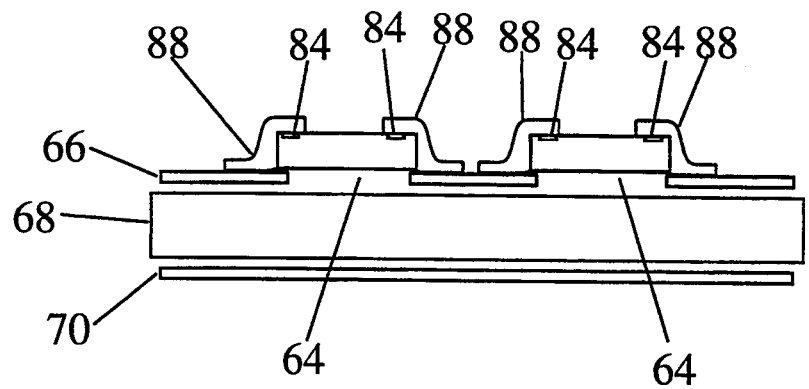

In FIG. 8f, the metal film has been etched to define electrical connections between desired contact pads on the particles.

Using means described above, it will be possible to employ several different types of particles in a given circuit. For example, one type of particle could be a silicon field-effect transistor, and a second could be a gallium-arsenide light-emitting diode. There is great demand for a means to combine silicon and gallium-arsenide circuit elements in an integrated circuit, but no such means is commercially available.

The substrate of the finished circuit is the dielectric sheet 68 which was originally part of the self-assembly template. Alternately, the circuit may be assembled on a thin dielectric membrane placed over the self-assembly template, allowing re-use of the template, and the production of a flexible or transparent circuit. Suitable membranes might be created from silicon nitride or various polymers.

Magnetic Binding Site

Figure 10:
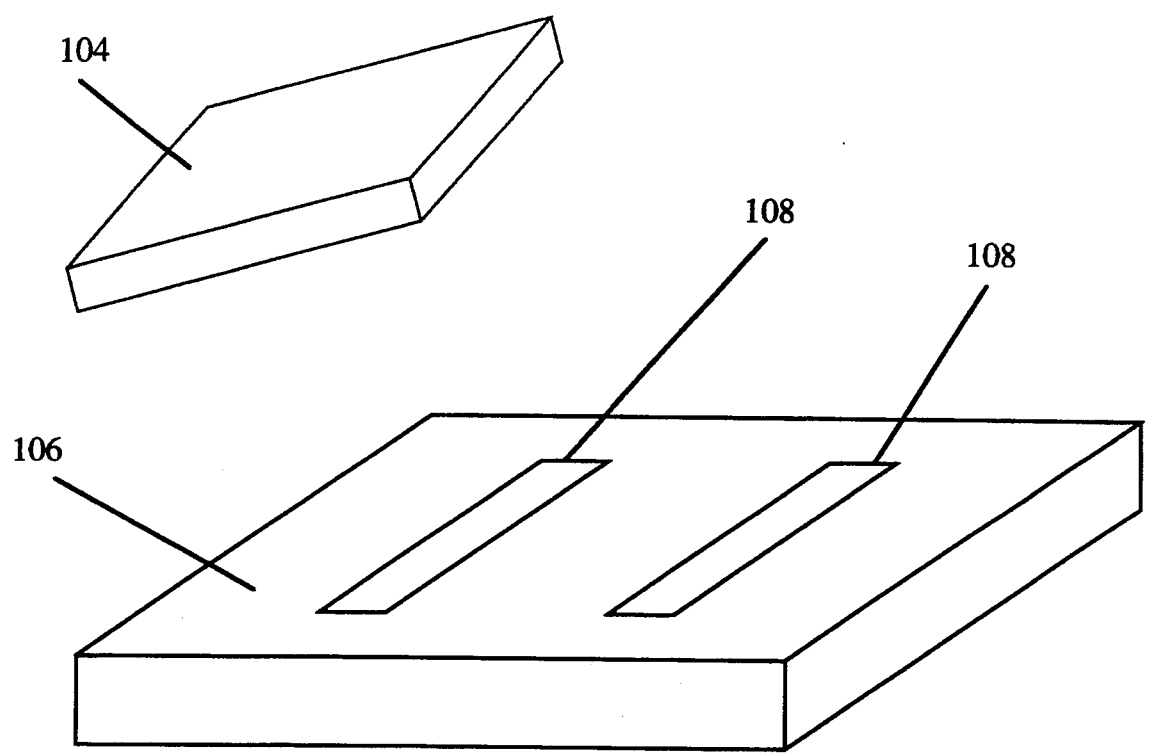
FIG. 10 shows a binding site consisting of magnetic domains on a film of magnetic recording medium, and a particle of low magnetic reluctance which will be bound at the site..

FIG. 10 shows a self-assembly template created on a planar magnetic medium 106, such as a floppy disk. Magnetic domains 108 are recorded on the medium. A permalloy-coated particle 104 is shown on the binding site.

When the particle bridges the two oppositely-poled magnetic domains 108, the potential energy of the system is minimized. Therefore, the particle will spontaneously bind to the binding site comprised by the magnetic domains. This scheme differs from that of Yando '416, in that the domains may be rapidly, economically, and microscopically created in arbitrary planar configurations by means of a magnetic recording head. No lamination or machining is necessary.

Levitation

Given that friction hinders self-assembly, it would be desirable to levitate particles during self-assembly, so that they would not contact the surface of the self-assembly template. This may be achieved by a variety of means, including air bearings, squeeze-film levitation, electrostatic or magnetic levitation.

Figure 11A:
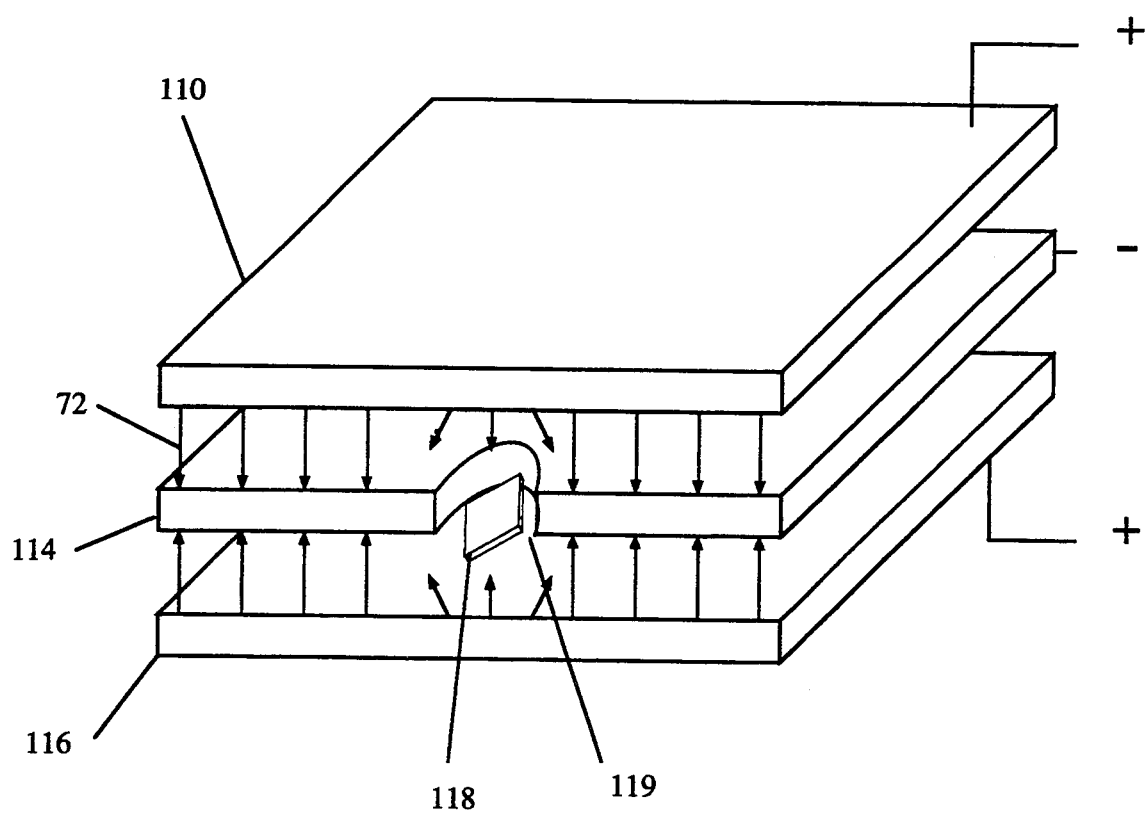
FIG. 11a shows a cross-section of a particle in a negative dielectrophoresis-type levitation trap.

One means suitable to self-assembly is negative dielectrophoresis levitation (NDEP) [T. B. Jones and G. W. Bliss, "Bubble Dielectrophoresis," *Journal of Applied Physics,* Vol. 48, No.4, April 1977]. FIG. 11a shows a particle trap employing NDEP. Three parallel planar electrodes 110, 114, 116 are immersed in a polarizable fluid (water). The top and bottom electrodes 110, 116 are held at positive potential, and the middle electrode 114 at negative potential. The middle electrode has an aperture 119. The electric field 72 is present everywhere between the plates, except in the vicinity of the aperture, where it cancels out.

Since water has a high dielectric constant, it is energetically preferred for it to occupy the regions of high electric field. Therefore, a particle 118 having low dielectric constant will be trapped in the aperture 119 in the middle electrode, where the electric field is weak. The particle is large enough to fill the trapping site, and thus excludes other particles from entering the site.

Figure 11B:
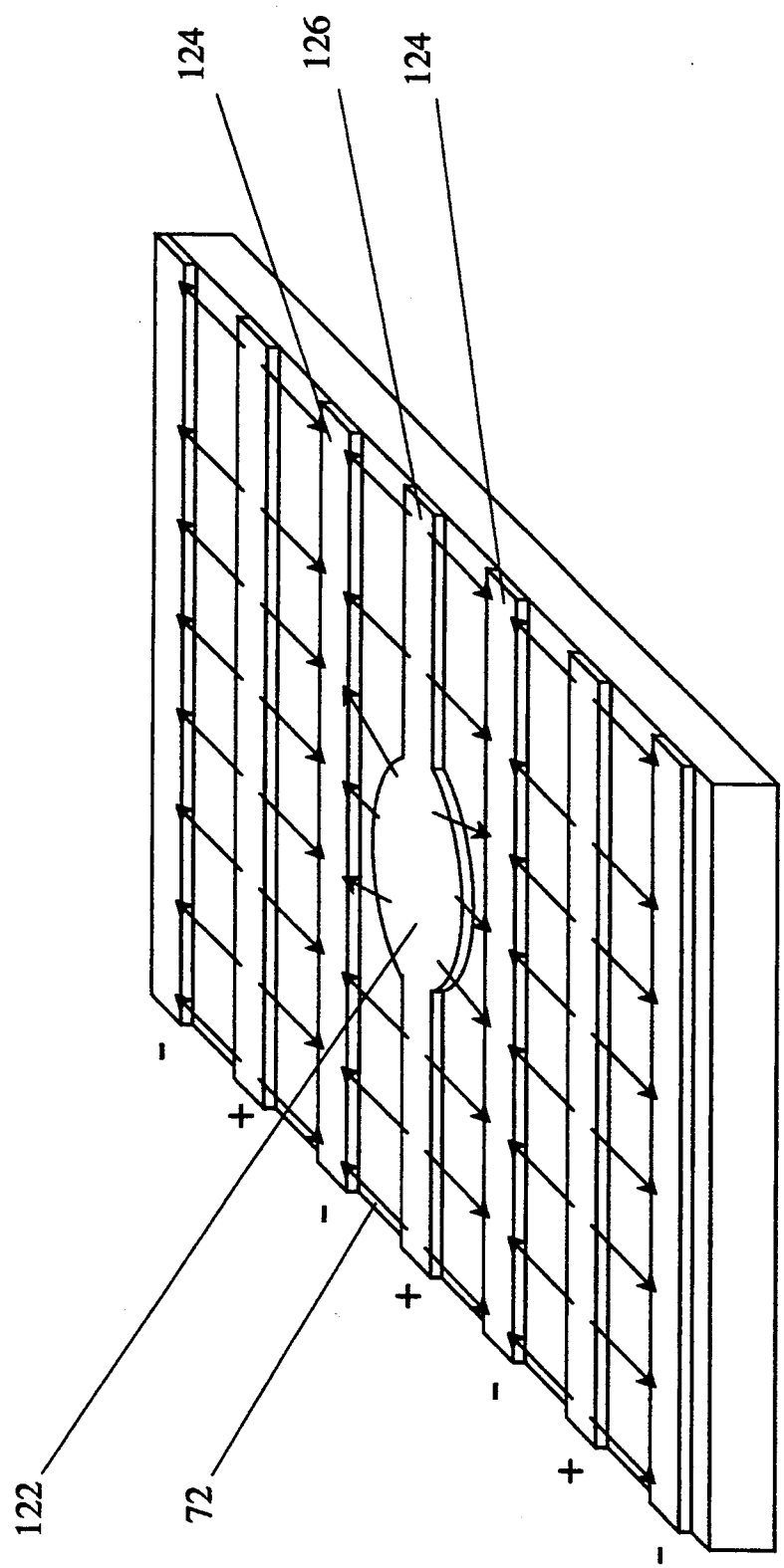
FIG. 11b shows a negative dielectrophoresis trap with a planar structure.

FIG. 11b shows another embodiment of the NDEP binding site. This binding site is planar in structure, so a three-dimensional template is unnecessary, and the planar NDEP trap may be conveniently fabricated using conventional microelectronics techniques.

In operation, the alternating strip electrodes 124, 126 are held at opposite potential. Thus, strong electric fields are present over the whole template, except in the vicinity of the binding site 122. Here, a circular electrode is provided, having size approximately that of the particles being trapped. Since the electrode is a conductor, the electric field over it is damped out, and the particles are attracted. (This is not the case for the strip electrodes, since they are narrow compared to the particles.)

Note that in practice, static voltages are not employed in NDEP. Rather, oscillating voltages of several kilohertz are employed to avoid ionic conduction and electrolysis in the water. Where electrodes are indicated as carrying opposite voltage, it is meant that they are driven by oscillating voltages, 180 degrees out of phase.

Ramifications

Another means of reducing the effects of friction is to give the particles a studded or textured surface. Many of the weak forces which cause microscopic particles to adhere are surface-mediated, so decreasing the available surface area decreases the adhesion and friction. This is the case for van der Waals attraction and surface layer damping in a gas medium.

CONCLUSION, RAMIFICATIONS, SCOPE OF INVENTION

Thus the reader will see that the self-assembly method and apparatus of the invention provides a means to rapidly, precisely, and economically assemble large numbers of small parts or particles. The assemblies can be two- or three-dimensional. Unlike the prior art, the pans may be assembled in arbitrary, not necessarily symmetrical, configurations. Therefore, the invention can aid in the manufacture of currently-made products. Also, the invention may make practical the manufacture of new types of products, including integrated microsystems which combine previously incompatible materials, and including three-dimensional integrated microsystems.

While my above description contains many specificities, these should not be construed as limits on the scope of the invention, but rather as an exemplification of preferred embodiments thereof. Many other variations are possible. For example, negative dielectrophoresis-type binding sites may be employed, or binding sites based on magnetically-recorded domains. The function of the loudspeaker may be served by a piezoelectric actuator or by immersing the whole self-assembly cell in an ultrasonic cleaner. Studs may be employed on the particles to reduce friction and adhesion. Finally, the particles in FIG. 9b could be formed completely of metal or conductor-impregnated material (e.g. photoresist). Accordingly, the scope of the invention should be determined not by the embodiments illustrated, but by the appended claims and their legal equivalents.

I claim:

1. Apparatus for arranging microfabricated devices in a predetermined planar pattern, comprising:
   (a) a cell or container for containing said microfabricated particles;
   (b) vibration means for rapidly agitating the particles within the container;
   (c) a template comprising
      (1) a first planar electrode overlying an inner surface of said container;
      (2) a second, parallel planar electrode substantially covering said first electrode, and having a plurality of apertures; and
   (d) a voltage source applied between the electrodes, whereby the voltage causes electric flux to emanate from each aperture, thus attracting and binding any particle which may randomly approach an aperture under influence of the vibration, allowing rapid assembly of the particles into substantially any desired pattern, as determined by the placement of the apertures.

2. The apparatus of claim 1, in which
   (a) each particle bears a conductive pad of a shape which is asymmetric with respect to rotation and reflection, and
   (b) each aperture is substantially identical in shape to said conductive pad,
   whereby each particle bound to an aperture will be oriented with its conductive pad in overlying and aligned relationship to the aperture, by the principle of minimization of potential energy.

3. The apparatus of claim 1, further comprising (a) particles of a first type, each first type of particle having a conductive pad of a predetermined shape on its surface;

(b) particles of a second type, each second type of particle having a conductive pad of a second predetermined shape on its surface, said second shape differing from said first shape, and wherein the apertures comprise first apertures whose shapes are substantially identical to the first shape and second apertures whose shapes are substantially identical to the second shape, whereby a voltage applied between the electrodes causes electric flux to emanate from the apertures, thus causing particles of the first type to be bound at the first apertures, and particles of the second type at the second apertures.

4. A method of fabricating an array of spaced discrete particles, comprising the steps of:

(a) providing a cell or container;

(b) providing a template comprising:
  (1) a first planar electrode overlying an inner surface of said container; and
  (2) a second, parallel planar electrode substantially covering said first electrode, and having a plurality of apertures;

(c) placing a plurality of the discrete particles in the container;

(d) applying a voltage source between the electrodes; and (e) agitating the particles, whereby the voltage causes electric flux to emanate from each aperture, thus attracting and binding any particle which may randomly approach an aperture under influence of the vibration, allowing rapid assembly of the particles into a desired planar pattern, as determined by the placement of the apertures.

5. The method of claim 4, in which (a) each particle bears a conductive pad of a shape which is asymmetric with respect to rotation and reflection, and (b) each aperture is substantially identical in shape to said conductive pad, whereby each particle bound to an aperture will be oriented with its conductive pad in overlying and aligned relationship to the aperture, by the principle of minimization of potential energy.

6. The method of claim 4, further comprising (a) particles of a first type, each first type of particle having a conductive pad of a predetermined shape on its surface;

(b) particles of a second type, each second type of particle having a conductive pad of a second predetermined shape on its surface, said second shape differing from said first shape, and wherein the apertures comprise first apertures whose shapes are substantially identical to the first shape and second apertures whose shapes are substantially identical to the second shape, whereby a voltage applied between the electrodes causes electric flux to emanate from the apertures, thus attracting and binding particles of the first type to the first apertures, and particles of the second type to the second apertures.

* * * * *